United States Patent
Cavallaro et al.

[11] Patent Number: 5,947,842
[45] Date of Patent: *Sep. 7, 1999

[54] MULTI-LAYER LOW-SPIN GOLF BALL

[75] Inventors: Christopher Cavallaro, Attleboro; Murali Rajagopalan, South Dartmouth, both of Mass.; Samuel A. Pasqua, Jr., Tiverton, R.I.; Herbert C. Boehm, Norwell, Mass.; Kevin M. Harris, New Bedford; Jeffrey L. Dalton, North Dartmouth, both of Mass.

[73] Assignee: Acushnet Company, Fairhaven, Mass.

[*] Notice: This patent is subject to a terminal disclaimer.

[21] Appl. No.: 09/041,726

[22] Filed: Mar. 13, 1998

Related U.S. Application Data

[63] Continuation-in-part of application No. 08/746,362, Nov. 8, 1996, Pat. No. 5,810,678, and a continuation-in-part of application No. 08/706,008, Aug. 30, 1996, Pat. No. 5,813,923, and a continuation-in-part of application No. 08/606,373, Feb. 23, 1996, Pat. No. 5,721,304, and a continuation-in-part of application No. 08/603,057, Feb. 16, 1996, Pat. No. 5,759,676, and a continuation-in-part of application No. 08/482,522, Jun. 7, 1995, Pat. No. 5,688,191.

[51] Int. Cl.$^6$ .............................. A63B 37/06; A63B 37/12
[52] U.S. Cl. ......................... 473/373; 473/374; 473/378
[58] Field of Search ....................... 473/373, 374, 473/376, 378

[56] References Cited

U.S. PATENT DOCUMENTS

| | | |
|---|---|---|
| 696,353 | 3/1902 | Richards . |
| 696,366 | 3/1902 | Kempshall . |
| 3,310,102 | 3/1967 | Trombe ..................... 165/133 |
| 3,359,231 | 12/1967 | Kent ......................... 524/493 |
| 3,490,146 | 1/1970 | Guichet ....................... 433/69 |
| 4,090,716 | 5/1978 | Martin et al. ............... 473/384 |
| 4,123,061 | 10/1978 | Dusbiber .................... 473/377 |
| 4,234,184 | 11/1980 | Deleens et al. ............. 473/378 |
| 4,337,947 | 7/1982 | Saito et al. ................. 473/356 |
| 4,398,000 | 8/1983 | Kataoka et al. ............. 525/437 |
| 4,431,193 | 2/1984 | Nesbitt ...................... 273/235 R |
| 4,625,964 | 12/1986 | Yamada ...................... 273/62 |
| 4,650,193 | 3/1987 | Molitor et al. ............. 273/228 |
| 4,714,253 | 12/1987 | Nakahara et al. .......... 273/228 |
| 4,781,383 | 11/1988 | Kamada et al. ............ 273/228 |
| 4,848,770 | 7/1989 | Shama ....................... 273/228 |
| 4,863,167 | 9/1989 | Matsuki et al. ............ 273/62 |
| 4,884,814 | 12/1989 | Sullivan ..................... 514/524 |
| 4,919,434 | 4/1990 | Saito ......................... 273/235 R |
| 4,984,804 | 1/1991 | Yamada et al. ............ 473/372 |
| 4,986,545 | 1/1991 | Sullivan ..................... 473/372 |
| 5,000,459 | 3/1991 | Isaac ......................... 473/356 |
| 5,002,281 | 3/1991 | Nakahara et al. .......... 273/220 |
| 5,026,067 | 6/1991 | Gentiluomo ................ 273/220 |
| 5,068,151 | 11/1991 | Nakamura .................. 428/407 |
| 5,069,532 | 3/1997 | Chikaraishi ................ 473/365 |
| 5,072,944 | 12/1991 | Nakahara et al. .......... 273/220 |
| 5,104,126 | 4/1992 | Gentiluomo ................ 273/238 |
| 5,120,791 | 6/1992 | Sullivan ..................... 525/196 |
| 5,150,906 | 9/1992 | Molitor et al. ............. 273/220 |
| 5,159,035 | 10/1992 | Evani ........................ 526/196 |

(List continued on next page.)

FOREIGN PATENT DOCUMENTS

| | | |
|---|---|---|
| 0 637 459 A1 | 2/1995 | European Pat. Off. . |
| 2 260 546 | 4/1993 | United Kingdom . |
| 2 267 908 | 12/1993 | United Kingdom . |
| 2 278 609 | 12/1994 | United Kingdom . |

*Primary Examiner*—George J. Marlo
*Attorney, Agent, or Firm*—Pennie & Edmonds LLP

[57] ABSTRACT

The present invention is directed towards a low-spin multi-layer golf ball which comprises a soft core, a cover layer and a mantle layer disposed between the core and cover layer, wherein the mantle layer has a shore D hardness of greater than 60 and a specific gravity of greater than about 1.2. The invention is also directed towards a golf ball comprising a core, cover layer, and a mantle layer, in which the core has a sufficient amount of calcium oxide to reduce core compression by at least about 2 compression points compared to a core consisting of the same mixture wherein zinc oxide is substituted in place of the calcium oxide.

27 Claims, 1 Drawing Sheet

U.S. PATENT DOCUMENTS

| | | | |
|---|---|---|---|
| 5,184,828 | 2/1993 | Kim et al. | 273/228 |
| 5,222,739 | 6/1993 | Horiuchi et al. | 473/356 |
| 5,253,871 | 10/1993 | Viollaz | 273/228 |
| 5,298,571 | 3/1994 | Statz et al. | 525/330 |
| 5,314,187 | 5/1994 | Proudfit | 273/235 R |
| 5,368,304 | 11/1994 | Sullivan et al. | 473/377 |
| 5,387,637 | 2/1995 | Sullivan | 473/377 X |
| 5,415,937 | 5/1995 | Cadorniga et al. | 428/407 |
| 5,439,227 | 8/1995 | Egashire et al. | 273/223 |
| 5,467,994 | 11/1995 | Moriyama et al. | 273/222 |
| 5,492,972 | 2/1996 | Stefani | 525/196 |
| 5,553,852 | 9/1996 | Higuchi et al. | 473/373 |
| 5,556,098 | 9/1996 | Higuchi et al. | 473/373 |
| 5,580,057 | 12/1996 | Sullivan et al. | 473/377 |
| 5,601,502 | 2/1997 | Hiraoka et al. | 473/373 |
| 5,688,191 | 11/1997 | Cavallaro | 473/373 |
| 5,759,676 | 6/1998 | Cavallaro | 428/215 |
| 5,779,562 | 7/1998 | Melvin et al. | 473/378 |
| 5,803,831 | 9/1998 | Sullivan et al. | 473/373 X |
| 5,810,678 | 9/1998 | Cavallaro et al. | 473/374 X |
| 5,813,923 | 9/1998 | Cavallaro et al. | 473/378 |

MULTI-LAYER LOW-SPIN GOLF BALL

CROSS REFERENCE TO RELATED APPLICATIONS

This application is a continuation-in-part of U.S. patent application Ser. Nos. 08/746,362 filed Nov. 8, 1996, now U.S. Pat. No. 5,810,678 Ser. No. 08/706,008 filed Aug. 30, 1996, now U.S. Pat. No. 5,813,923, Ser. No. 08/606,373 filed Feb. 23, 1996 and now U.S. Pat. No. 5,721,304, Ser. No. 08/603,057 filed Feb. 16, 1996 now U.S. Pat. No. 5,759,676, and Ser. No. 08/482,522 filed Jun. 7, 1995 and now U.S. Pat. No. 5,688,191.

FIELD OF THE INVENTION

This invention relates generally to golf balls, and more specifically, to a multi-layer golf ball. In particular, this invention relates to a golf ball having a core, a cover and one or more mantle layers disposed between the core and cover. This invention is also directed to a composition used for the manufacture of golf ball cores, mantle layers and covers for the multi-layer golf ball. The multi-layer golf balls of the present invention have been found to provide improved distance characteristics such as high initial velocity and low spin.

BACKGROUND OF THE INVENTION

Conventional golf balls can be divided into two general types or groups: two piece balls or wound balls (also know as three piece balls). The difference in play characteristics resulting from these different types of constructions can be quite significant.

Balls having a two piece construction are generally most popular with the average recreational golfer because they provide a very durable ball while also providing maximum distance. Two piece balls are made with a single solid core, usually made of a crosslinked rubber, which is encased by a cover material. Typically the solid core is made of polybutadiene which is chemically crosslinked with zinc diacrylate and/or similar crosslinking agents and is covered by a tough, cut-proof blended cover. The cover is generally a material such as SURLYN®, which is a trademark for an ionomer resin produced by DuPont. The combination of the core and cover materials provide a "hard" ball that is virtually indestructible by golfers. Further, such a combination imparts a high initial velocity to the ball which results in improved distance. Because these materials are very rigid, two piece balls have a hard "feel" when struck with a club. Likewise, due to their hardness, these balls have a relatively low spin rate which provides greater distance.

At the present time, the wound ball remains the preferred ball of the more advanced players due to its spin and feel characteristics. Wound balls typically have either a solid rubber or liquid center core around which many yards of a stretched elastic thread or yarn are wound. The wound core is then covered with a durable cover material such as a SURLYN® or similar material or a softer cover such as Balata or polyurethane. Wound balls are generally softer and provide more spin, which enables a skilled golfer to have more control over the ball's flight and final position. Particularly, with approach shots into the green, the high spin rate of soft, wound balls enables the golfer to stop the ball very near its landing position.

Manufacturers place a great deal of emphasis on producing golf balls that consistently achieve the highest possible velocity with a range of different properties and characteristics, such as spin, compression, "click," and "feel." Thus, a variety of different balls is available to meet the needs and desires of a wide range of golfers. Regardless of the form of the ball, players generally seek a golf ball that delivers maximum distance, which requires a high initial velocity and low spin upon impact.

A number of polymers, such as polybutadiene, natural rubber, styrene butadiene, and isoprene, are commonly used in fabricating golf ball cores. Today, golf ball cores are predominantly made of polybutadiene. Moreover, in order to obtain the desired physical properties for golf balls, manufacturers have added cross-linking agents, such as metallic salts of an unsaturated carboxylic acid. The amount of cross-linking agent added is typically about 20 to 50 parts per hundred parts of polybutadiene. Most commonly, zinc diacrylate or zinc dimethacrylate are used for this purpose. Of these two cross-linkers, zinc diacrylate has been found to produce golf balls with greater initial velocity than zinc dimethacrylate.

Typically, about 5 to 50 pph (parts per hundred) of zinc oxide (ZnO) is also added to the composition. This material serves as both a filler and an activation agent for the zinc diacrylate/peroxide cure system. The zinc diacrylate/peroxide cure system, which is well known to those of ordinary skill in this art, cross-links the polybutadiene during the core molding process.

As zinc oxide is known to be environmentally regulated, it would be advantageous to eliminate or at least substantially reduce the amount of this material from the manufacturing process. However, when the zinc oxide is eliminated from the composition described above, there is a reduction in cure enhancement, which results in less cross-linking and a corresponding reduction in compression and velocity. This result provides a ball with a softer feel, and allows less skilled golfers to compress the ball fully, but the resulting ball has less than the maximum velocity allowed by the USGA standard.

Therefore, it would be advantageous to provide a golf ball core composition with an activation agent other than zinc oxide, i.e., wherein all or at least some of the zinc oxide commonly present was eliminated, which would, as noted above, provide a ball with a lower compression, but would maintain the velocity and distance of a high compression ball. The present invention provides such golf ball cores.

DESCRIPTION OF THE PRIOR ART

Several patents have been issued which are directed towards modifying the properties of a conventional two piece ball by altering the typical single layer core and single cover layer construction to provide a multi-layer core. The inventions disclosed in the prior art patents are directed towards improving a variety of golf ball characteristics.

Several patents are directed towards improving the carry distance of the ball. For example, U.S. Pat. No. 4,863,167 relates to a three piece solid golf ball having improved rebound characteristics in order to increase its flight distance. This golf ball has a center portion and the outer layer formed from a rubber composition, preferably having a base rubber of polybutadiene, wherein the outer layer further contains a filler such as tungsten or tungsten carbide so as to impart a higher specific gravity to the outer layer than that of the inner layer. The difference in specific gravity of the layers should be 0.15–0.8 for small balls and 0.15–0.45 for large balls. Preferably, the outer layer is harder than the center portion.

U.S. Pat. No. 5,184,828 relates to a solid three-piece golf ball having improved rebound characteristics and carry distance while maintaining an adequate spin rate. These characteristics are obtained by controlling the size of the inner core and outer layer as well as the specific gravity and hardness. The core and mantle layers are made from a rubber compound such as polybutadiene, and have a Shore D hardness of 30–62 and 30–56 respectively. The key to obtaining the desired rebound characteristics is that the maximum hardness (42–62) must be located at the interface between the core and the mantle and the hardness must then decrease both inwardly and outwardly.

U.S. Pat. No. 4,714,253 is also directed towards a three-piece golf ball having an excellent rebound coefficient. This golf ball has a core with a Shore C hardness of 57–80 in its center, but not more than 83 at a distance between 5–10 mm from its center and an outer layer with a Shore C hardness of 70–83.

Additionally, there are a number of patents also directed towards improving the spin, click and feel of solid balls while maintaining the distance provided by the solid construction. A variety of approaches to manipulating the core construction are described in the art. For example, U.S. Pat. No. 5,072,944 discloses a three-piece solid golf ball having a center and outer layer which are prepared from a rubber composition, preferably having a base rubber of polybutadiene. It is desirable that the center core is softer than the outer layer, each having a hardness (Shore C) of 25–50 and 70–90 respectively.

U.S. Pat. No. 4,625,964 relates to a solid golf ball having a polybutadiene rubber core of a diameter not more than 32 mm, and a polybutadiene rubber intermediate layer having a specific gravity of lower than that of the core material, and a cover.

U.S. Pat. No. 4,650,193 is directed towards a solid golf ball having a core comprising of a central portion and an integral outer layer. Preferably the core is a curable elastomer such as polybutadiene which is treated with a cure altering agent to soften an outer layer of the core, thereby producing a central layer with a hardness (Shore C) of greater than 75 and an outer layer with a hardness (Shore A) of less than 80.

U.S. Pat. No. 4,848,770 discloses a non-wound three-piece golf ball which includes a core of a highly filled synthetic rubber or polymeric material, an intermediate mantle of an unfilled synthetic rubber and a cover. The core and intermediate mantle have a hardness of between 50–95.

U.S. Pat. No. 5,002,281 is directed towards a three-piece solid golf ball which has an inner core having a hardness of 25–70 (Shore C), an outer shell having a hardness of 80–95 (Shore C) and a cover. Further, the specific gravity of the inner core must be greater than 1.0, but less than or equal to that of the outer shell, which must be less than 1.3.

U.S. Pat. No. 5,253,871 concerns a golf ball having a three piece structure comprising an elastomer core, an intermediate layer of a thermoplastic material containing at least 10% of amide block copolymer, preferably blended with an ionomer and a thermoplastic cover.

Further, there are also several patents which are directed to golf balls having multiple cover layers. For example U.S. Pat. No. 4,431,193 relates to a golf ball having a multi-layer cover wherein the inner layer is a hard, high flexural modulus ionomer resin and the outer layer is a soft, low flexural modulus ionomer resin, and wherein either or both layers may comprise a foamed ionomer resin.

U.S. Pat. No. 5,314,187 also relates to golf balls having a multiple layer cover, wherein the outer layer is molded over the inner layer and comprises a blend of balata and an elastomer and the inner layer is an ionomer resin.

U.S. Pat. No. 4,919,434 is directed towards a golf ball having a cover which comprises an inner layer and an outer layer each of which comprise a thermoplastic resin, preferably the layers comprise of materials that are capable of fusion bonding with each other.

U.S. Pat. No. 5,556,098 is directed to a three-piece solid golf ball comprising a center core, an intermediate layer, and a cover. The center core is formed of a polybutadine base rubber and a specific gravity of less than 1.4, and a hardness up to 80 on JIS C scale. The intermediate layer is formed of a thermoplastic polyester elastomer and has a specific gravity of less than 1.2, and a hardness of less than 80 on JIS C scale. The cover has a hardness of at least 85 on JIS C scale.

U.S. Pat. No. 5,439,227 is directed to a multi-piece solid golf ball having a solid core including an inner layer circumscribed by an outer layer. The core inner layer is formed from a rubber composition. The core outer layer is formed by a polyether ester type thermoplastic elastomer having a Shore D hardness of 30–50. The core is surrounded by a cover of an ethylene-(meth)acrylate copolymer ionomer having a flexural modulus of 200–450 MPa and a Shore D hardness of 55–68.

U.S. Pat. No. 5,415,937 is directed to a golf ball cover comprised of 80 to 50% by weight of a high stiffness ionomer and 20 to 50% by weight of a low stiffness ionomer.

However, none of these patents disclose a multi-layer ball having the materials and material property requirements as disclosed herein to provide the improved golf balls of the present invention.

SUMMARY OF THE INVENTION

The present invention is directed towards a multi-layer golf ball which provides improved playing characteristics by using specific core, mantle and cover formulations. More particularly, the present invention is directed to balls having a softer feel, while also providing superior distance, low spin, durability and ease of manufacturing. Generally, the prior art has been directed at making golf balls perform like a three piece ball by providing a softer cover. The present invention is directed to improved golf balls that have low driver spin rates and substantial distance more like conventional two piece balls, but have a soft feel by using a soft core, harder thermoplastic mantle layer, and a harder cover.

The present invention is further directed towards a multi-layer golf ball which comprises a core with one or more layers; at least one cover layer; and one or more mantle layers disposed between the core and cover layer. The core is preferably comprised of a polybutadiene rubber having an activation agent of calcium oxide and/or zinc oxide. The mantle layer has a Shore D hardness greater than 60 and preferably comprises thermoplastic copolyetherester block copolymer, thermoplastic copolyesterester block copolymer, thermoplastic polyurethane, thermoset polyurethane, polyamide, dynamically vulcanized thermoplastic elastomer, styrene-butadiene, hydrogenated styrene-butadiene, styrene-isoprene and styrene-isoprene elastomers with a functional group such as maleic anhydride or sulfonic acid, polymer made using a metallocene catalyst, or blends thereof and/or thermoset materials. The cover preferably has a shore D of 65 or greater and comprises a thermoplastic or thermosetting material.

The present invention is still further directed to a multi-layer golf ball which comprises a core, at least one cover layer and at least one mantle layer disposed between the core and cover layer wherein properties such as the thickness, specific gravity, hardness, flexural modulus, tensile modulus, compression or Bashore resilience of the various layers is such as to provide a ball with improved playing characteristics.

The present invention is also directed to an improved low-spin, multi-layer golf ball having a softer golf ball core composition. The composition of the golf ball core comprises a base mixture of polybutadiene, a metal salt diacrylate or dimethacrylate, preferably, zinc diacrylate in an amount of about 20 to 50 parts per hundred parts of polybutadiene, and a free radical initiator, to which at least some calcium oxide (CaO) is added instead of zinc oxide as an activation agent in an amount sufficient to produce a golf ball core with the advantageous properties discussed below.

It has been found that when calcium oxide is used in a golf ball core composition as an activating agent, a lower compression golf ball core can be obtained, which, when incorporated into a finished golf ball, provides a ball with an initial velocity in the USGA test that is comparable in velocity and distance to a standard, high compression ball that incorporates a core using only zinc oxide. The calcium oxide can be added in an amount that reduces the compression of the golf ball, while maintaining the initial velocity of the ball in the USGA test. Typically, the amount of calcium oxide incorporated into the core composition of the invention is between about 0.1 and 15 parts per 100 parts of polybutadiene. The amount of calcium oxide used is preferably less than about 15 pph because when more than 15 pph is used there appears to be a large decrease in the golf ball core compression that results in a significant reduction in the initial velocity of balls incorporating such cores.

Still further, in the preferred low spin golf ball, fillers may be removed from the core and added to the mantle layer and/or the cover. By moving weight from the core to the mantle layer and/or the cover, the spin rate of the ball is decreased. Moreover, it has been found that the compression of the ball can be decreased by removing the fillers from the core and adding them to the mantle layer and cover. This improves the feel of the golf ball.

The invention thus provides a novel golf ball composition that offers enhanced performance properties.

DETAILED DESCRIPTION OF THE PREFERRED EMBODIMENTS

The following terms that are used in this application are defined in terms of the enumerated ASTM tests:

| | |
|---|---|
| Specific gravity | ASTM D - 297[1] |
| Flexural (Flex) Modulus | ASTM D - 790[2] |
| Shore D Hardness | ASTM D - 2240 |
| Tensile Modulus | ASTM D - 638[3] |
| Bashore resiliency | ASTM D - 2632[4] |

[1]Tests were carried out in lab conditions where temperature was controlled to 20–23° C. Humidity was not controlled.
[2]Tests were carried out using a 0.2 in/min cross-head speed and a 2 inch span length in the three point bending mode. Test samples were annealed at 140° F. for 24 hours and the tests were performed no earlier than 24 hours after annealing.
[3]Tests were carried out on type IV specimens using a 2 in/min cross-head speed without an extensiometer. Test samples were annealed at 140° F. for 24 hours and the tests were performed no earlier than 24 hours after annealing.
[4]Four (4) ⅛ inch samples were plied together to achieve the ½ inch test thickness.

For purposes of the present invention, the term "reaction conditions" can refer to any reaction condition that can affect the ability of the inventive core compositions to form free radicals. Reaction conditions include, for example, temperature, time and pressure.

As used herein, the terms "compression" or "compression points" refer to the compression scale based on the ATTI Engineering Compression Tester. This scale, which is well known to those working in this field, is used in determining the relative compression of a core or ball and is sometimes referred to as the PGA compression. Some artisans use the Reihle compression scale instead of the standard compression scale. Based on disclosure in U.S. Pat. No. 5,368,304, column 20, lines 55–53 it appears that Reihle compression values can be converted to compression point through the use of the following equation:

$$\text{compression points} = 160 - \text{Reihle compression value}.$$

Figure 1:
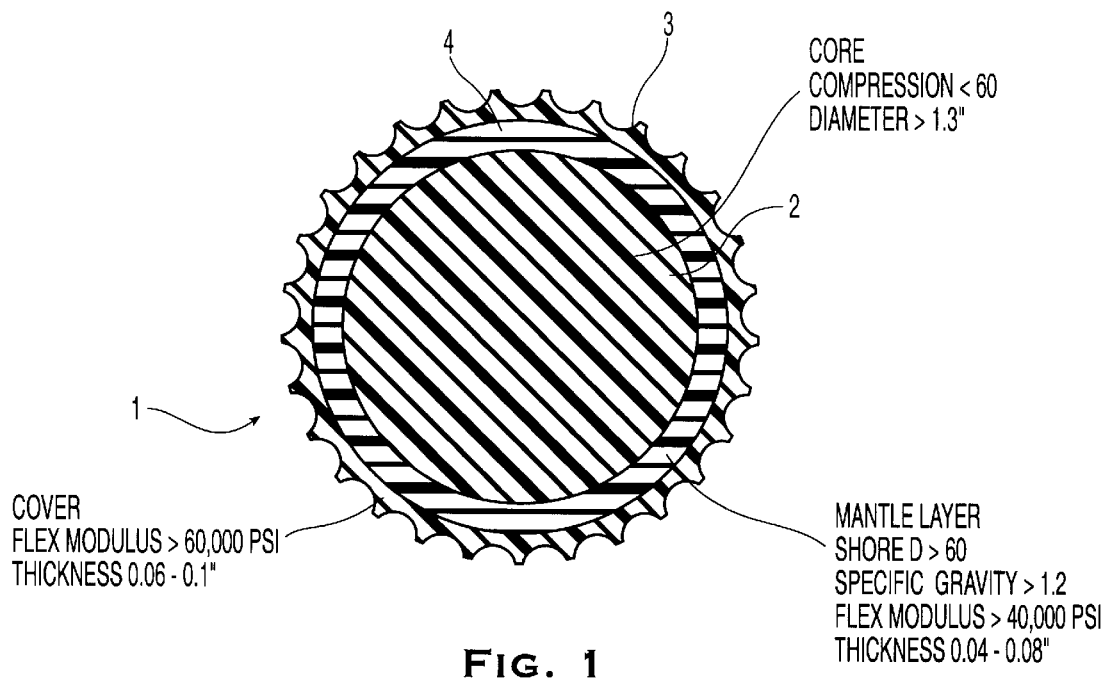
FIG. 1 is a cross-sectional view of a golf ball according to the present invention.
Figure 2:
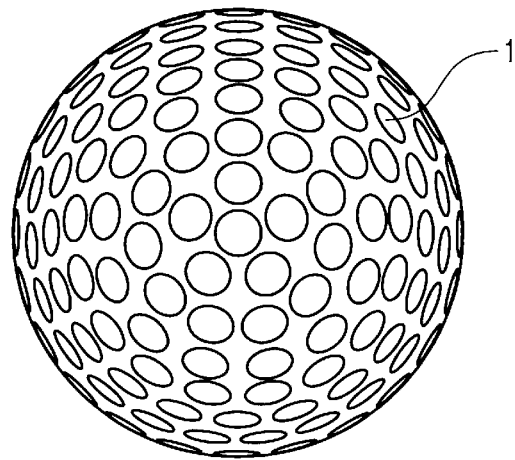
FIG. 2 is a perspective view of a golf ball according to the present invention.

Referring to FIGS. 1 and 2, this invention is particularly directed towards a multi-layer golf ball 1 which comprises a core 2, at least one cover layer 3 and at least one mantle layer 4 disposed therebetween.

A representative base composition for forming the golf ball core 2, prepared in accordance with the present invention, comprises polybutadiene and, in parts by weight based on 100 parts polybutadiene, 20–50 parts of a metal salt diacrylate, dimethacrylate, or monomethacrylate, preferably zinc diacrylate. The polybutadiene preferably has a cis 1,4 content of above about 90% and more preferably above about 96%. Commercial sources of polybutadiene include Shell 1220 manufactured by Shell Chemical, Neocis BR40 manufactured by Enichem Elastomers, and Ubepol BR150 manufactured by Ube Industries, Ltd. If desired, the polybutadiene can also be mixed with other elastomers known in the art, such as natural rubber, styrene butadiene, and/or isoprene in order to further modify the properties of the core. When a mixture of elastomers is used, the amounts of other constituents in the core composition are usually based on 100 parts by weight of the total elastomer mixture.

Metal salt diacrylates, dimethacrylates, and monomethacrylates suitable for use in this invention include those wherein the metal is magnesium, calcium, zinc, aluminum, sodium, lithium or nickel. Zinc diacrylate is preferred, because it provides golf balls with a high initial velocity in the USGA test. The zinc diacrylate can be of various grades of purity. For the purposes of this invention, the lower the quantity of zinc stearate present in the zinc diacrylate the higher the zinc diacrylate purity. Suitable, commercially available zinc diacrylates include those from Rockland React-Rite and Sartomer. The preferred concentrations of zinc diacrylate that can be used are 20–50 pph based upon 100 pph of polybutadiene or alternately, polybutadiene with a mixture of other elastomers that equal 100 pph.

Free radical initiators are used to promote cross-linking of the metal salt diacrylate, dimethacrylate, or monomethacrylate and the polybutadiene. Suitable free radical initiators for use in the invention include, but are not limited to peroxide compounds, such as dicumyl peroxide, 1,1-di(t-butylperoxy) 3,3,5-trimethyl cyclohexane, a—a bis (t-butylperoxy) diisopropylbenzene, 2,5-dimethyl-2,5 di (t-butylperoxy) hexane, or di-t-butyl peroxide, and mixtures thereof. Other useful initiators would be readily apparent to one of ordinary skill in the art without any need for experimentation. The initiator(s) at 100% activity are preferably added in an amount ranging between about 0.05 and 2.5 pph based upon 100 parts of butadiene, or butadiene mixed with one or more other elastomers. More preferably, the amount of initiator added ranges between about 0.15 and 2 pph and most preferably between about 0.25 and 1.5 pph.

A typical prior art golf ball core incorporates 5 to 50 pph of zinc oxide in a zinc diacrylate-peroxide cure system that cross-links polybutadiene during the core molding process.

In the present invention, at least some of the zinc oxide (ZnO) is eliminated in favor of calcium oxide (CaO) in the golf ball core composition. The cores and balls produced from such an admixture typically exhibit enhanced performance properties. The initial velocity of the standard ball is maintained at or near the maximum allowed by the USGA, but the compression of the ball is reduced by at least about 2 compression points on the standard compression scale, and may be reduced as much as 14 points. On the other hand, the combination of the use of calcium oxide and a higher percentage of zinc diacrylate can be used to maintain the same compression as with the zinc oxide, but the initial velocity is significantly increased. Where the amount of zinc oxide incorporated in prior art cores is, as noted above, typically about 5 to 50 pph, the amount of calcium oxide added to the core-forming composition of the invention as an activator is typically in the range of about 0.1 to 15, preferably 1 to 10, most preferably 1.25 to 5, parts calcium oxide per hundred parts (pph) of polybutadiene.

The compositions of the present invention may also include fillers, added to the elastomeric composition to adjust the density and/or specific gravity of the core. As used herein, the term "fillers" includes any compound or composition that can be used to vary the density and other properties of the subject golf ball core. Fillers useful in the golf ball core according to the present invention include, for example, zinc oxide (in an amount significantly less than that which would be necessary without the addition of the calcium oxide), barium sulfate, and regrind (which is recycled core molding matrix ground to 30 mesh particle size). The amount and type of filler utilized is governed by the amount and weight of other ingredients in the composition, since a maximum golf ball weight of 1.620 ounces (45.92 gm) has been established by the USGA. Appropriate fillers generally used range in specific gravity from about 2.0 to 5.6. In the preferred golf ball, the amount of filler is lower than that of a typical golf ball such that the specific gravity of the core is decreased. As will be discussed in more detail below, the filler removed from the core is added to the mantle layer and/or the cover of the preferred golf ball.

The golf ball core 2, as shown in FIG. 1, in typical prior art golf balls have a specific gravity of about 1.2 to provide a ball with a weight of about 1.62 ounces. The preferred range of specific gravities of the present invention is from about 1.0 to about 1.2, more preferably in the range of about 1.1 to about 1.18 for a ball having a weight between 1.60 and 1.62 ounces, depending upon the size of the core, cover, mantle layer and finished ball, as well as the specific gravity of the cover and mantle layer.

Antioxidants may also be included in the elastomer cores produced according to the present invention. Antioxidants are compounds which prevent the breakdown of the elastomer. Antioxidants useful in the present invention include, but are not limited to, quinoline type antioxidants, amine type antioxidants, and phenolic type antioxidants.

Other ingredients such as inhibitors, e.g. hydroquinone or butylated hydroxy toluene, processing aids, processing oils, plasticizers, dyes and pigments, as well as other additives well known to the skilled artisan may also be used in the present invention in amounts sufficient to achieve the purpose for which they are typically used.

The core compositions of the invention are produced by forming a mixture comprising at least polybutadiene, zinc diacrylate, and calcium oxide. Either the calcium oxide is used to reduce the compression by at least about 2 points on the compression scale, compared to a core composition having zinc oxide or the amount of zinc diacrylate is increased such that the compression is the same, but the initial velocity is increased. In other words, by using calcium oxide, preferably the ball compression is lowered and the initial velocity maintained or, in the alternative, the amount of zinc diacrylate can be increased so that the ball compression is about the same and the initial velocity is increased. The Examples below set forth these principals and show the advantage of using calcium oxide.

When a set of predetermined conditions is met, i.e., time and temperature of mixing, the free radical initiator is added in an amount dependent upon the amounts and relative ratios of the starting components, as would be well understood by one of ordinary skill in the art. In particular, as the components are mixed, the resultant shear causes the temperature of the mixture to rise. Peroxide(s) free radical initiator(s) are blended into the mixture for crosslinking purposes in the molding process.

After completion of the mixing, the golf ball core composition is milled and hand prepped or extruded into pieces ("preps") suitable for molding. The preps are then compression molded into cores at an elevated temperature. Typically, 160° C. (320° F.) for 15 minutes is suitable for this purpose. These cores can then be used to make finished golf balls by surrounding the cores with mantle and cover materials.

EXAMPLES

These and other aspects of the present invention may be more fully understood with reference to the following non-limiting examples, which are merely illustrative of the preferred embodiment of the present invention golf ball core, and are not to be construed as limiting the invention, the scope of which is defined by the appended claims.

The results obtained with golf ball cores and balls prepared according to the examples are representative of the improved performance characteristics of golf ball cores made from the compositions of this invention.

Table I sets forth the contents of the golf ball cores that were made to illustrate the effect of using calcium oxide instead of zinc oxide. The control core and Examples 1–3 all contain zinc oxide. Example 4 was made without zinc oxide or calcium oxide and Examples 5–9 were made with different amounts of calcium oxide. The compositions used to prepare the golf ball cores of these examples are all in parts per hundred (pph), based on 100 parts of polybutadiene. The fillers used in the compositions of these examples are regrind and barium sulfate (BaSO$_4$). Vulcup 4OKE® and Varox 231XL® are free radical initiators, and are a-a bis (t-butylperoxy) diisopropylbenzene and 1,1-di (t-butylperoxy) 3,3,5-trimethyl cyclohexane, respectively. Yel MB is a yellow pigment in a styrene butadiene binder, which is used to color the composition for identification purposes.

All the ingredients except the peroxides were mixed in a Process Lab Brabender mixer to 82.2–93.3° C. (180–200° F.). The peroxides were added in the second stage to the initial mixture, and the resulting mixture was removed from the Brabender and blended on a lab mill to insure homogeneity. After mixing, the admixture was then hand rolled using a laboratory mill and cut into pieces or "preps". These preps were then compression molded at 160° C. (320° F.) for 15 minutes to form the cores. To fabricate the finished golf balls, the cores were inserted into two cover hemispheres of a lithium-sodium blend of SURLYN®, which were molded to encase the core.

The cores and balls prepared according to the above-described method were tested for their compression and initial velocity. The compression ratings were obtained using a commercial compression tester. The initial velocity results were obtained from a standard technique, whereby the cores or balls are struck at 39.6 m/s (130 ft/s), and pass through light gates, which measure their speed. Both of these standard measurement techniques are well-known to those of ordinary skill in the art of making golf ball cores and balls.

As shown below in TABLE II, reduction in the zinc oxide concentrations in Examples 1–3 results in a slight decrease in ball compression and a slight drop in initial velocity compared to the control ball. Similar results are obtained with the core. The complete removal of zinc oxide in Example 4 reduces the compression of both the core and the ball by a significant amount, greater than 10 points, but also reduces the initial velocity of the core and ball significantly, approximately one mile per hour. When the zinc oxide is eliminated from the core composition, and calcium oxide is added in Examples 5–8, both the cores and finished balls containing calcium oxide have a lower compression, but the initial velocity of the low compression balls and cores is comparable to that of the high compression control ball.

TABLE I

| Example No. | Control | 1 | 2 | 3 | 4 | 5 | 6 | 7 | 8 | 9 |
| --- | --- | --- | --- | --- | --- | --- | --- | --- | --- | --- |
| Polybutadiene | 100 | 100 | 100 | 100 | 100 | 100 | 100 | 100 | 100 | 100 |
| Regrind | 16.3 | 16.3 | 16.3 | 16.3 | 16.3 | 16.3 | 16.3 | 16.3 | 16.3 | 16.3 |
| Vulcup 40KE ® | 0.23 | 0.23 | 0.23 | 0.23 | 0.23 | 0.23 | 0.23 | 0.23 | 0.23 | 0.23 |
| Varox 231XL ® | 0.43 | 0.43 | 0.43 | 0.43 | 0.43 | 0.43 | 0.43 | 0.43 | 0.43 | 0.43 |
| BaSO$_4$ | 20.5 | 22.0 | 23.1 | 24.2 | 25.8 | 21.5 | 22.5 | 23.5 | 24.7 | 12.0 |
| Yel. MB | 0.10 | 0.10 | 0.10 | 0.10 | 0.10 | 0.10 | 0.10 | 0.10 | 0.10 | 0.10 |
| Zinc Diacrylate | 26.9 | 26.9 | 26.9 | 26.9 | 26.9 | 26.9 | 26.9 | 26.9 | 26.9 | 26.9 |
| Zinc Oxide | 5.0 | 3.75 | 2.50 | 1.25 | — | — | — | — | — | — |
| Calcium Oxide | — | — | — | — | — | 5.0 | 3.75 | 2.50 | 1.25 | 15.0 |

TABLE II

| Example No. | Control | 1 | 2 | 3 | 4 | 5 | 6 | 7 | 8 | 9 |
| --- | --- | --- | --- | --- | --- | --- | --- | --- | --- | --- |
| Zinc Oxide (pph) | 5.0 | 3.75 | 2.50 | 1.25 | — | — | — | — | — | — |
| Calcium Oxide (pph) | — | — | — | — | — | 5.0 | 3.75 | 2.50 | 1.25 | 15.0 |
| Core Initial Velocity (ft/s) | 250.63 | 250.74 | 250.55 | 250.52 | 249.38 | 250.56 | 250.30 | 250.21 | 250.24 | 248.56 |
| Ball Initial Velocity (ft/s) | 252.62 | 252.83 | 252.62 | 252.43 | 251.71 | 252.91 | 252.80 | 252.81 | 252.55 | 250.92 |
| Core Compression | 81 | 82 | 79 | 78 | 70 | 70 | 69 | 69 | 71 | 44 |
| Ball Compression | 97 | 100 | 98 | 97 | 90 | 88 | 88 | 86 | 88 | 63 |

Further, the core of the present invention has a Bashore resilience of about 30 to about 80. Preferably the core has a Bashore resilience of about 40 to about 70. The core has a Shore D hardness of about 30 to about 65. Preferably, the core has a Shore D hardness of about 35 to about 60 and a compression less than 80 such that the ball compression is less than about 90. Most preferably, the core compression is less than about 60 and is low enough to make the ball compression less than or equal to about 80.

Turning now to the mantle layer 4, it has a hardness of greater than Shore D 60, and preferably, comprises thermoplastic copolyesterester block copolymer, dynamically vulcanized thermoplastic elastomer, styrene-butadiene elastomer with functional groups such as maleic anhydride or sulfonic acid attached, thermoplastic polyurethane or polymers made using a metallocene catalyst or blends thereof.

The mantle layer of the present invention has a Bashore resilience of about 35 to about 75. Preferably the mantle layer has a high Bashore resilience of greater than 55. In a preferred embodiment of the present invention, the mantle layer 4 is a thermoplastic copolyetherester block copolymer. Suitable thermoplastic copolyetheresters include Hytrel® 6356 and Hytrel® 7246 which are commercially available from DuPont. Hytrel® 6356 being the most preferred.

Prior art mantle layers generally have a specific gravity of about 1 or less. As stated above, the objective of most prior art multi-layer balls is to increase spin. The mantle layer according to the present invention preferably has a specific gravity greater than about 1.2. Most preferably, the specific gravity of the mantle layer is increased to about 1.25 by adding about 20% of a filler such as barium sulfate, zinc oxide, titanium dioxide and combinations thereof. The most preferred low spin golf ball is comprised of a mantle layer made of Hytrel® 6356 and about 20% zinc oxide. By increasing the specific gravity of the mantle layer and decreasing the specific gravity of the core, the moment of inertial is increased, which will contribute to a lower initial spin rate.

Suitable dynamically vulcanized thermoplastic elastomers include Santoprene®, Sarlink®, Vyram®, Dytron® and Vistaflex®. Santoprene® is the trademark for a dynamically vulcanized PP/EPDM. Santoprene® 203-40 is an example of a preferred Santoprene® and is commercially available from Advanced Elastomer Systems. An example of suitable functionalized styrene-butadiene elastomers, i.e., styrene-butadiene elastomers with functional groups such as maleic anhydride or sulfonic acid, is Kraton G7680 which is available from the Shell Corporation. Examples of suitable thermoplastic polyurethanes include Estane® 58861 and Estane® 58091, which are commercially available from the B.F. Goodrich Company. Suitable metallocene polymers, i.e., polymers made with a metallocene catalyst, whose melting points are higher than the cover materials can also be employed in the mantle layer of the present invention. Further, the materials for the mantle layer described above may be in the form of a foamed polymeric material. For example, suitable metallocene polymers include foams of thermoplastic elastomers based on metallocene single-site catalyst-based foams.

In another preferred embodiment of the present invention, the mantle layer is a blend of a first and a second thermoplastic, wherein the first thermoplastic is a thermoplastic copolyetherester block copolymer, copolyesterester block copolymer, a dynamically vulcanized thermoplastic elastomer, a functionalized styrene-butadiene elastomer, a functionalized hydrogenated styrene-butadiene block copolymer, a thermoplastic polyurethane or a metallocene polymer and the second thermoplastic is a material such as a thermoplastic polyurethane, a thermoplastic polyetherester or polyetheramide, a thermoplastic ionomer resin, a copolymer of ethylene and acrylic or methacrylic acid, a terpolymer of ethylene, acrylic or methacrylic acid and n-alkyl acrylate, a thermoplastic polyester, or blends thereof.

Illustrated in Table III are a number of batch formulations for several mantle layer compositions of the present invention, as well as properties such as hardness (Shore D), Bashore resilience, flexural modulus, % strain at break and tensile modulus for the compositions.

The following examples of mantle layer compositions are given to illustrate the novel multi-layer golf balls of the present invention. However, it is to be understood that the examples are only for illustrative purposes and in no manner is the present invention limited to the specific disclosures therein.

TABLE III

Mantle Layer Compositions and Properties

| | Sample | Hardness (Shore D) | Resilience % | Flex Modulus (psi) | Tensile Modulus (psi) | Strain at Break % |
|---|---|---|---|---|---|---|
| 1A | Hytrel 6356 | 63 | >55 | 48,000 | | 420 |
| 1B | Hytrel 7246 | 72 | >55 | 83,000 | | 300 |
| 2A | Estane 58091 | 78 | 46 | 147,240 | 211,288 | 10 |
| 2B | 75% Estane 58091 25% Estane 58861 | 61 | 34 | 43,030 | 69.918 | 149 |
| 3A | Estane 5809 | 77 | 50 | 156,070 | 182,869 | 9 |
| 3B | 25% Hytrel 3078 75% Estane 58091 | 65 | 48 | 87,680 | 96,543 | 33 |
| 4A | Kraton 7890 | 61 | | | 13,700 | 550 |

The golf balls of the present invention have a mantle layer with a Shore D hardness of greater than about 60. Preferably, the Shore D hardness of the mantle layer is about 60 to about 70.

The cover layers of the present invention comprises at least one layer of a thermoplastic or thermosetting material. Any number of a wide variety of cover materials may be used in the present invention. Among the preferred conventional cover materials are ionomer resins. More particularly, monomers, such as copolymer ionomers comprised of an olefin such as ethylene and an alpha, beta-unsaturated carboxylic acid such as methacrylic acid wherein 10% to 90% of the carboxylic acid groups are neutralized by a metal cation such as lithium, sodium, potassium, magnesium, calcium, barium, lead, tin, zinc or aluminum. Specific acid-containing ethylene copolymers include ethylene/acrylic acid, ethylene/methacrylic acid, ethylene/acrylic acid/n-butyl acrylate, ethylene/methacrylic acid/n-butyl acrylate, ethylene/methacrylic acid/iso-butyl acrylate, ethylene/acrylic acid/iso-butyl acrylate, ethylene/methacrylic acid/n-butyl methacrylate, ethylene/acrylic acid/methyl methacrylate, ethylene/acrylic acid/methyl acrylate, ethylene/methacrylic acid/methyl acrylate, ethylene/methacrylic acid/methyl methacrylate, and ethylene/acrylic acid/n-butyl methacrylate.

The manner in which these ionomers are made is well-known in the art as described in e.g. U.S. Pat. No. 3,262,272. Such ionomer resins are commercially available from DuPont Co. under the tradename SURLYN®. A presently preferred cover material for a low spin embodiment of the present invention is a 50/50 blend of SURLYN® 8920 and SURLYN® 9910 which are a sodium ionomer made with about 15% methacrylic acid and a zinc ionomer made with about 15% methacrylic acid, respectively. This cover material has a flexural modulus of about 60 ksi. Another preferred cover is comprised of a 20/30/50 blend of SURLYN® 8140, SURLYN® 8920 and SURLYN® 9910. SURLYN® 8140 is a lithium SURLYN® having about 19% methacrylic acid. This cover material has a flexural modulus of about 65 ksi. Preferably, the flexural modulus of the cover is greater than 60 ksi. Most preferably, the cover has a flexural modulus of between 60 ksi and 70 ksi.

Typically, SURLYN® covers have a specific gravity of about 0.96. The cover of the present invention can be further comprised of a filler such as barium sulfate, zinc oxide, titanium oxide, or combinations thereof mixed into the thermoplastic or thermosetting material. The specific gravity can be increased from about 0.96 to about 1.25 to increase the balls moment of inertia and reduce the golf ball's initial spin rate.

In addition, the present invention also contemplates the use of a variety of non-conventional cover materials, i.e., not SURLYN®, balata or polyurethane. In particular, the covers of the present invention may comprise thermoplastic or engineering plastics such as ethylene or propylene based homopolymers and copolymers including functional monomers such as acrylic and methacrylic acid and fully or partially neutralized ionomers and their blends, methyl acrylate, methyl methacrylate homopolymers and copolymers, imidized, amino group containing polymers, polycarbonate, reinforced polyamides, polyphenylene oxide, high impact polystyrene, polyether ketone, polysulfone, poly(phenylene sulfide), reinforced engineering plastics, acrylonitrile-butadiene, acrylic-styrene-acrylonitrile, poly(ethylene terephthalate), poly(butylene terephthalate), poly(ethylene-vinyl alcohol), poly(tetrafluoroethylene) and their copolymers including functional comonomers and blends thereof. These polymers or copolymers can be further reinforced by blending with a wide range of fillers and glass fibers or spheres or wood pulp.

The properties such as compression, specific gravity, hardness, Bashore resilience, modulus, core diameter and mantle layer thickness of the golf balls of the present invention have been found to effect play characteristics such as spin, initial velocity and feel of the present golf balls.

In particular, the thickness of the mantle layer of the present invention is about 0.025 inches to about 0.125 inches. Preferably, the thickness of the mantle layer is about 0.04 inches to about 0.10 inches. Most preferably, the thickness of the mantle layer is about 0.045 to 0.070 inches. Similarly, the diameter of the core of the present invention is about 1.25 inches to about 1.51 inches. Preferably the diameter of the core is about 1.30 inches to about 1.48 inches. Most preferably, the diameter of the core is about 1.45 inches. The overall diameter of the core and mantle layer is about 84% to about 97% of the overall diameter of the finished ball, and is preferably about 1.58 inches.

Preferably, the specific gravity of the core is less than about 1.2. The mantle layer preferably has a specific gravity greater than about 1.2 and, most preferably, about 1.25. The cover can have a specific gravity of greater than 1.

The golf balls of the present invention can be made by any conventional process employed in the golf ball art. For example, the solid cores can be either injection or compression molded. Similarly, the undersized wound cores of the present invention are produced through conventional means. The mantle layer is subsequently injection or compression molded about the core. It is important that the mantle material be able to sustain the temperatures applied during the application of the cover layer. The cover layer or layers are then injection or compression molded or cast about the mantle layer.

In the manufacturing of the ball, the core is preferably compression molded as stated above. The mantle layer is molded over the core using a retractable-pin mold. The cover is then compression molded over the mantle layer.

What is claimed is:

1. A golf ball comprising:
a core having a compression of less than 80;
a cover layer; and
a mantle layer disposed between the core and cover layer, the mantle layer having a hardness of greater than 60 Shore D and a specific gravity greater than 1.2.

2. The golf ball of claim 1, wherein the mantle layer has a filler selected from the group of barium sulfate, zinc oxide, titanium dioxide and combinations thereof.

3. The golf ball of claim 1, wherein the ball has a weight greater than about 1.6 ounces.

4. The golf ball of claim 1, wherein the core has a compression of less than 60 points.

5. The golf ball of claim 4, wherein the mantle layer has a flexural modulus of greater than 40,000 psi.

6. The golf ball of claim 5, wherein the cover has a flexural modulus of greater than about 60,000 psi.

7. The golf ball of claim 1, wherein the core has a diameter greater than 1.3 inches.

8. The golf ball of claim 7, wherein the mantle layer has a thickness of about 0.04 to 0.08 inches and the cover has a thickness of about 0.06 to 0.1 inches.

9. The golf ball of claim 1, wherein the cover has a filler selected from the group of barium sulfate, zinc oxide, titanium dioxide and combinations thereof and has a specific gravity greater than about 1.2.

10. The golf ball of claim 1 wherein the mantle layer is comprised of a polymer selected from the group of thermoplastic copolyetherester block copolymer, thermoplastic copolyesterester block copolymer, thermoplastic polyurethane and thermoset polyurethane.

11. The golf ball of claim 1 wherein the mantle layer has a Bashore resilience of greater than 55.

12. A golf ball comprising:
a core made from a mixture comprising at least polybutadiene, a metal salt, and calcium oxide;
a cover layer; and
a mantle layer disposed between the core and cover layer, the mantle layer having a hardness of greater than 60 Shore D;
and wherein the core has a sufficient amount of calcium oxide to reduce core compression by at least 2 compression points compared to a core consisting of the same mixture wherein zinc oxide is substituted in place of the calcium oxide.

13. The golf ball of claim 12, wherein the core has a compression of less than 60 points.

14. The golf ball of claim 12, wherein the amount of calcium oxide in said mixture is from about 1 to about 10 parts per 100 parts of polybutadiene.

15. The golf ball of claim 12, wherein the amount of calcium oxide in said mixture is from about 1.25 to about 5 parts per 100 parts of polybutadiene.

16. The golf ball of claim 12, wherein the polybutadiene has a cis-1,4-polybutadiene content of at least about 90%.

17. The golf ball of claim 12, wherein the metal salt is zinc diacrylate.

18. A golf ball comprising:
a core having a compression of less than 80;
a cover layer having a hardness greater than 65 Shore D; and
a mantle layer disposed between the core and cover layer, the mantle layer having a hardness of greater than 60 Shore D.

19. The golf ball of claim 18, wherein the mantle layer has a filler selected from the group of barium sulfate, zinc oxide, titanium dioxide and combinations thereof in an amount such that the specific gravity of the mantle layer is greater than 1.2.

20. The golf ball of claim 18, wherein the ball has a weight greater than about 1.6 ounces.

21. The golf ball of claim 18, wherein the core has a compression of less than 60 points.

22. The golf ball of claim 18, wherein the mantle layer has a flexural modules of greater than 40,000 psi.

23. The golf ball of claim 22, wherein the cover has a flexural modules of greater than about 60,000 psi.

24. The golf ball of claim 18, wherein the core has a diameter greater than 1.3 inches.

25. The golf ball of claim 18, wherein the mantle layer has a thickness of about 0.04 to 0.08 inches and the cover has a thickness of about 0.05 to 0.1 inches.

26. The golf ball of claim 18, wherein the mantle layer is comprised of a polymer selected from the group of thermoplastic copolyetherester block copolymer, thermoplastic copolyesterester block copolymer, thermoplastic polyurethane and thermoset polyurethane.

27. The golf ball of claim 18, wherein the mantle layer has a Bashore resilience of greater than 55.

* * * * *